United States Patent
Wang et al.

(10) Patent No.: US 9,572,270 B2
(45) Date of Patent: Feb. 14, 2017

(54) DETACHABLE DISPLAY MODULE AND DISPLAY DEVICE COMPRISING THE SAME

(71) Applicant: BOE Technology Group Co., Ltd., Beijing (CN)

(72) Inventors: Zifeng Wang, Beijing (CN); Yan Ren, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 69 days.

(21) Appl. No.: 14/650,764

(22) PCT Filed: Oct. 14, 2014

(86) PCT No.: PCT/CN2014/088588
§ 371 (c)(1),
(2) Date: Jun. 9, 2015

(87) PCT Pub. No.: WO2015/180372
PCT Pub. Date: Dec. 3, 2015

(65) Prior Publication Data
US 2016/0286670 A1    Sep. 29, 2016

(30) Foreign Application Priority Data
May 29, 2014 (CN) .......................... 2014 1 0234530

(51) Int. Cl.
*H05K 5/02* (2006.01)
*G06F 1/16* (2006.01)
(Continued)

(52) U.S. Cl.
CPC ........... *H05K 5/0217* (2013.01); *G06F 1/1637* (2013.01); *G09F 9/33* (2013.01); *H05K 5/0017* (2013.01)

(58) Field of Classification Search
CPC .............................. G06F 1/1637; H05K 5/0217
See application file for complete search history.

(56) References Cited

U.S. PATENT DOCUMENTS 1,381,726 A * 6/1921 Marr .................... B60R 25/0228
70/210
1,381,762 A * 6/1921 Starr ........................ A47G 1/06
40/734

(Continued)

FOREIGN PATENT DOCUMENTS

| CN | 1960609 A | 5/2007 |
| CN | 101118714 A | 2/2008 |

(Continued)

OTHER PUBLICATIONS

Mar. 30, 2015—International Search Report and Written Opinion for Appn PCT/CN2014/088588 with Eng Tran.

(Continued)

*Primary Examiner* — Adrian S Wilson
(74) *Attorney, Agent, or Firm* — Banner & Witcoff, Ltd.

(57) ABSTRACT

A detachable display module and a display device comprising the same are provided. The detachable display module comprises a front frame, a display screen and a back plate. The front frame is of a detachable structure and comprises a first frame, a second frame, a third frame and a fourth frame. A first frame is fixedly connected with a second frame and a fourth frame through bridge connection pieces; and a third frame is detachably and fixedly connected with the back plate. The back plate is provided on a rear surface of the display screen, and the back plate is provided with a recess portion corresponding to a printed circuit board provided between the back plate and the display screen.

19 Claims, 6 Drawing Sheets

(51) Int. Cl.
G09F 9/33 (2006.01)
H05K 5/00 (2006.01)

(56) References Cited

U.S. PATENT DOCUMENTS

| | | | | |
|---|---|---|---|---|
| 5,986,726 | A * | 11/1999 | Murai | G02F 1/133308 349/58 |
| 2002/0075253 | A1 * | 6/2002 | Park | G02F 1/13452 345/211 |
| 2003/0223189 | A1 * | 12/2003 | Chen | G11B 33/1426 361/679.55 |
| 2004/0156168 | A1 * | 8/2004 | LeVasseur | G06F 3/0414 361/679.21 |
| 2006/0017665 | A1 * | 1/2006 | Ko | G09G 3/3233 345/76 |
| 2006/0250563 | A1 | 11/2006 | Nishita | |
| 2008/0048953 | A1 * | 2/2008 | Koh | G09G 3/3225 345/82 |
| 2012/0162875 | A1 | 6/2012 | Shimomichi | |

FOREIGN PATENT DOCUMENTS

| | | |
|---|---|---|
| CN | 102595845 A | 7/2012 |
| CN | 102929014 A | 2/2013 |
| CN | 102980146 A | 3/2013 |
| CN | 104021733 A | 9/2014 |
| CN | 203849935 U | 9/2014 |
| EP | 1956419 A1 | 8/2008 |
| JP | 2008052039 A | 3/2008 |
| WO | 2014051060 A1 | 4/2014 |

OTHER PUBLICATIONS

Oct. 27, 2015—(CN)—First Office Action Appn 201410234530.2 with Eng Tran.
Apr. 12, 2016—(CN)—Second Office Action Appn 201410234530.2 with English Tran.

* cited by examiner

DETACHABLE DISPLAY MODULE AND DISPLAY DEVICE COMPRISING THE SAME

The application is a U.S. National Phase Entry of International Application No. PCT/CN2014/088588 filed on Oct. 14, 2014, designating the United States of America and claiming priority to Chinese Patent Application No. 201410234530.2 filed on May 29, 2014. The present application claims priority to and the benefit of the above-identified applications and the above-identified applications are incorporated by reference herein in their entirety.

TECHNICAL FIELD

Embodiments of the disclosure relate to a detachable display module and a display device comprising the detachable display module.

BACKGROUND

A conventional display module adopts a structure in which the printed circuit boards are connected on a single side, but the display module with such structure only meets general requirements of display and has relatively poor display effects. With developments of electronic display products, some display devices such as ultra-high-definition display or emerging organic light emitting diode display have their display modules adopt a structure in which the printed circuit boards are connected on multiple sides in order to achieve optimum display effects and meet requirements of high-end functions.

SUMMARY OF THE DISCLOSURE

Embodiments of the present disclosure provide a detachable display module, and the detachable display module comprises: a front frame, a display screen and a back plate. A plurality of COFs are provided on each of four sides of the display screen, the plurality of COFs provided on each side of the display screen are connected to at least one printed circuit board, and the printed circuit board is provided on a rear surface of the display screen; the front frame is fixedly connected with the display screen, and the front frame comprises: a first frame and a third frame disposed opposite to each other, a second frame and a fourth frame disposed opposite to each other, wherein the first frame is detachably and fixedly connected with the second frame and the fourth frame through bridge connection pieces, the third frame is detachably and fixedly connected with the back plate, and the first frame, the second frame, the third frame and the fourth frame each have a recess regions for accommodating the plurality of COFs; and the back plate is provided on the rear surface of the display screen, and the back plate is provided with a recess portion corresponding to the printed circuit board provided between the back plate and the display screen.

For example, the bridge connection piece comprises two positioning blocks connected with each other; both ends of the first frame, an end of the second frame to be connected with the first frame, and an end of the fourth frame to be connected with the first frame are provided with two protrusions, and a positioning groove is formed between the two protrusions; and the positioning groove and the positioning block are interlocked.

For example, the positioning blocks and the protrusion are fixed together by engaging with each other; the two positioning blocks are provided with engagement hooks at opposite distal ends, and the protrusions are provided with engagement grooves engaging with the engagement hooks.

For example, the bridge connection piece further comprises a seaming block provided between the two positioning blocks; and after the first frame is fixedly connected with the second frame or the fourth frame by the bridge connection piece, an outer side surface of the seaming block is aligned with that of the second frame or the fourth frame.

For example, the seaming block is of an L-shaped structure, and the two positioning blocks are respectively provided on two sides of the L-shaped structure; and the two positioning blocks and a vertical portion of the L-shaped structure form a cross-shaped positioning structure.

For example, a side of each of the first frame, the second frame and the fourth frame facing the display screen is provided with a adhesive, so that the display screen is bonded with the first frame, the second frame and the fourth frame by the adhesive, respectively.

For example, the detachable display module further comprises an insulating sheet provided between the printed circuit board and the back plate.

For example, the detachable display module further comprises a back plate rear shell provided on a rear surface of the back plate and fixedly connected with the back plate. The back plate rear shell is fixedly connected with the third frame.

For example, two printed circuit boards are connected to each side of the display screen, the printed circuit boards provided on an upper side, a left side and a right side of the display screen are provided between the display screen and the back plate, and the printed circuit boards provided on a lower side of the display screen are provided on a side of the back plate rear shell away from the display screen.

For example, the back plate is provided with a cabling channel for accommodating a connection line of the printed circuit board provided between the back plate and the display screen, and the back plate is further provided with at least one outlet hole for drawing out the connection line.

The embodiments of the disclosure further provide a display device, and the display device comprises the detachable display module as mentioned above.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DESCRIPTION OF THE EMBODIMENTS

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

In order to reduce the difficulty in producing the display device and improve the production efficiency of the display device, the embodiments of the disclosure provide a detachable display module and a display device comprising the detachable display module. In the embodiments of the disclosure, the front frame is designed to be of a detachable structure, which reduces the producing difficulty of the front frame and improves the production efficiency of the front frame, thereby improving the production efficiency of the display device.

Figure 1:
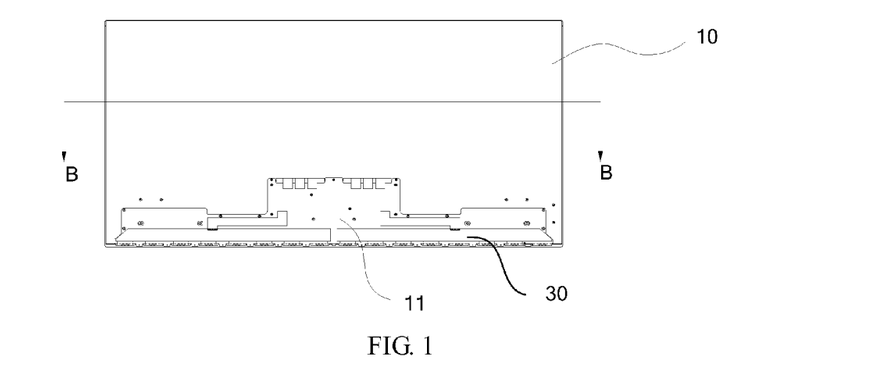
FIG. 1 is a rear view illustrating a detachable display module according to embodiments of the disclosure.
Figure 2:
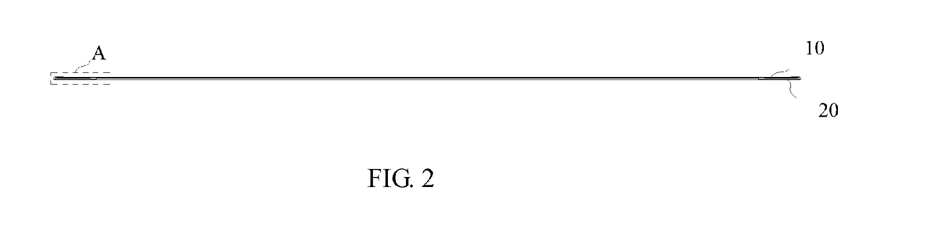
FIG. 2 is a cross-sectional view taken along B-B of FIG. 1.
Figure 3:
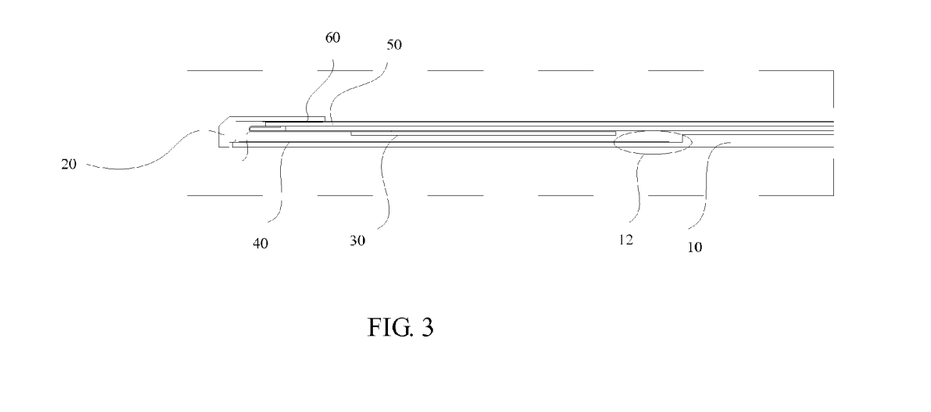
FIG. 3 is a partial enlarged view of portion A of FIG. 2.
Figure 4:
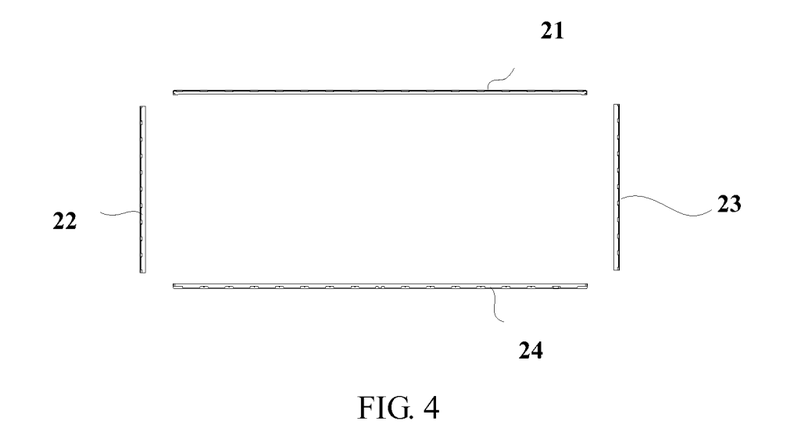
FIG. 4 is a structural schematic view illustrating a front frame according to the embodiments of the disclosure.

FIG. 1 is a rear view illustrating the detachable display module according to the embodiments of the disclosure; FIG. 2 is a cross-sectional view taken along B-B of FIG. 1; FIG. 3 is a partial enlarged view of portion A of FIG. 2; and FIG. 4 is a structural schematic view illustrating the front frame according to the embodiments of the disclosure.

As shown in FIG. 1 to FIG. 4, the embodiments of the disclosure provide the detachable display module, and the detachable display module comprises: a front frame 20, a display screen 50 and a back plate 10.

A plurality of Chip On Films (COFs) 51 are provided on each of four sides of the display screen 50, the plurality of COFs 51 provided on each side are connected to at least one printed circuit board 30, and the printed circuit board 30 is provided on a rear side of the display screen 50.

The front frame 20 is fixedly connected with the display screen 50, and the front frame 20 comprises: a first frame 21 and a third frame 24 disposed opposite to each other, a second frame 22 and a fourth frame 23 disposed opposite to each other. The first frame 21 is detachably and fixedly connected with the second frame 22 and the fourth frame 23 through bridge connection pieces 80; the third frame 24 is detachably and fixedly connected with the back plate 10; and the first frame 21, the second frame 22, the fourth frame 23 and the third frame 24 each have a recess region for accommodating the plurality of COFs 51. As shown in FIG. 4, the case that the first frame 21 is an upper frame, the second frame 22 is a left frame, the third border 24 is a lower frame, and the fourth frame 23 is a right frame is illustrated as an example.

The back plate 10 is provided on the rear side of the display screen 50, and the back plate 10 is provided with a recess portion 12 corresponding to the printed circuit board 30 provided between the back plate 10 and the display screen 50.

In the above-mentioned embodiments, the front frame 20 is designed to be of a detachable structure, which facilitates the production of the front frame 20. In the production process, the first frame 21, the second frame 22, the fourth frame 23 and the third frame 24 of the front frame 20 are produced respectively. As compared with a conventional front frame of integral structure, the structure of each of the first frame 21, the second frame 22, the fourth frame 23 and the third frame 24 is much simpler; thus the difficulty in production of the front frame 20 according to the embodiments of the disclosure is reduced. A production efficiency of the first frame 21, the second frame 22, the fourth frame 23 and the third frame 24 is higher than that of the integral front frame, and the first frame 21, the second frame 22, the fourth frame 23 and the third frame 24 may be produced simultaneously; thus, the production efficiency of the front frame 20 is improved by using the detachable structure, and thereby the production efficiency of the display device is improved. Furthermore, since a size of each of the first frame 21, the second frame 22, the fourth frame 23 and the third frame 24 is much smaller than a size of the front frame of integral structure, a smaller mold is employed and raw materials are used more reasonably so that waste is reduced, thus the production cost of the display device is reduced.

The front frame 20 is made of any suitable materials; for example, the front frame 20 is made of a metal material, thus ensuring that the front frame 20 after assembled has a strong supporting capability. For example, the four sides of the front frame 20 undergo diamond cutting, so that the front frame 20 has a good appearance. The back plate 10 is made of any suitable materials; for example, the back plate 10 is made of a carbon fiber material. The weight of the carbon fiber material is lighter than that of aluminum and the strength of the carbon fiber material is higher than that of steel, and the carbon fiber material has characteristics of high corrosion resistance and high modulus, so the back plate 10 has a lighter weight and is capable of providing a better supporting capability.

In the above-described embodiments, the first frame 21 is fixedly connected with the second frame 22 and the fourth frame 23 through the bridge connection pieces 80, respectively. During performing the connections, the first frame 21 is positioned to be fixed together with the second frame 22 and the fourth frame 23. The bridge connection piece 80 may be of different structures.

Hereinafter, the structures of the bridge connection piece 80 will be described in detail in conjunction with the drawings.

Figure 5:
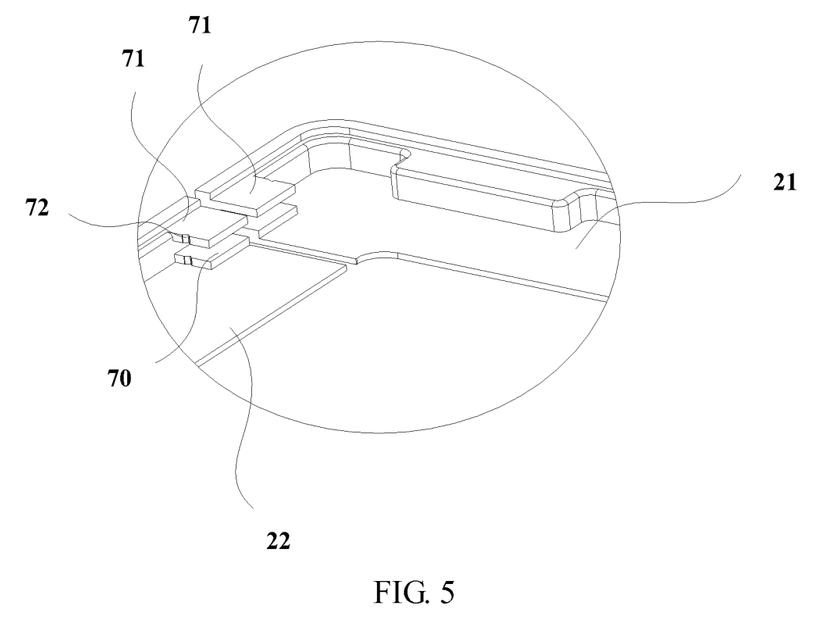
FIG. 5 is a structural schematic view illustrating the end of the first frame to be connected with the second frame and the end of the second frame to be connected with the first frame according to the embodiments of the disclosure.
Figure 6:
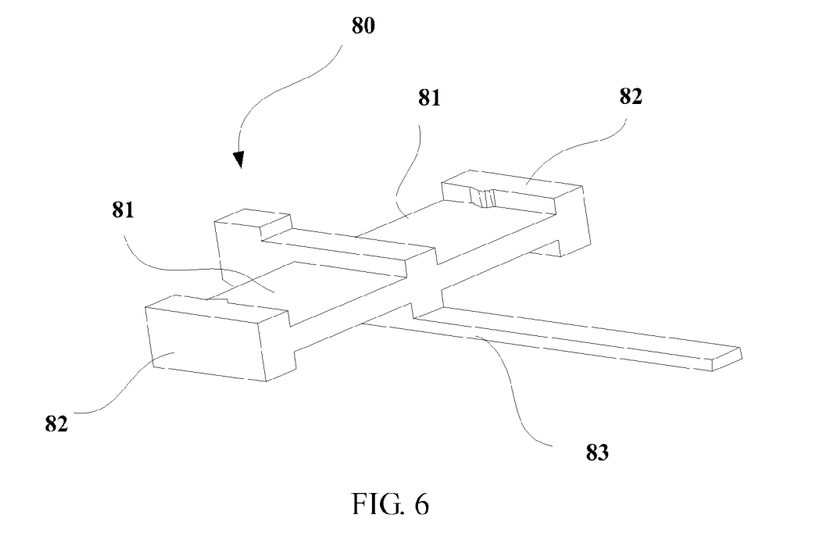
FIG. 6 is a structural schematic view illustrating a bridge connection piece according to the embodiments of the disclosure.
Figure 7:
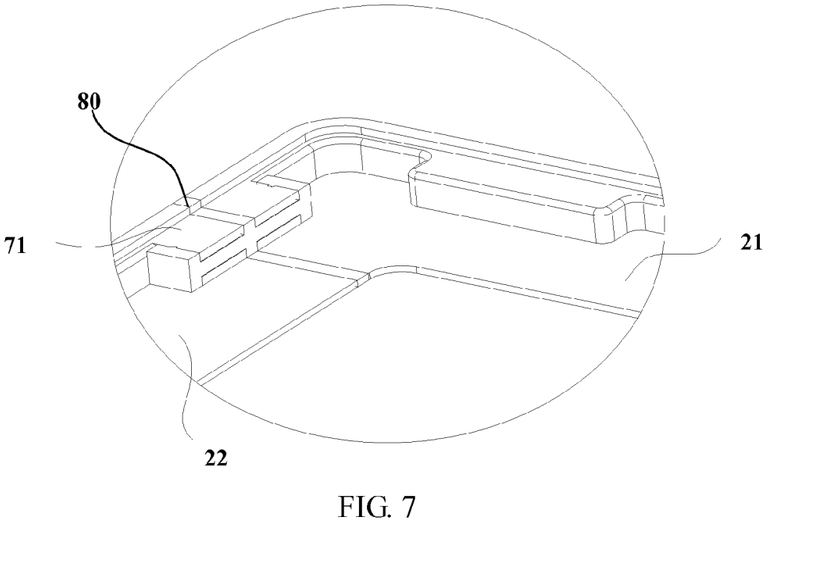
FIG. 7 is a structural schematic view illustrating the first frame and the second frame after being connected with each other by the bridge connection piece according to the embodiments of the disclosure.

As shown in FIG. 5 to FIG. 7, the bridge connection piece 80 comprises two positioning blocks 81 connected with each other; both ends of the first frame 21, the end of the second frame 22 to be connected with the first frame 21, and the end of the fourth frame 23 to be connected with the first frame 21 are provided with two protrusions 71, and a positioning groove 70 is formed between the two protrusions 71; and the positioning groove 70 and the positioning block 81 are interlocked.

More specifically, the bridge connection piece 80 comprises two positioning blocks 81 connected with each other, one of the positioning blocks 81 is connected to the first frame 21, and the other of the positioning blocks 81 is connected to the second frame 22 or the fourth frame 23; for convenience of description, the case that the first frame 21 is connected with the second frame 22 will be described hereinafter as an example. FIG. 5 is a structural schematic view illustrating the end of the first frame to be connected with the second frame and the end of the second frame to be connected with the first frame according to the embodiments of the disclosure; FIG. 6 is a structural schematic view illustrating the bridge connection piece according to the embodiments of the disclosure; and FIG. 7 is a structural schematic view illustrating the first frame and the second frame after being connected with each other by the bridge connection piece according to the embodiments of the disclosure. With reference to FIG. 5, the end of the first frame 21 to be connected with the second frame 22 is provided with two protrusions 71 and the positioning groove 70 is formed between the two protrusions 71, and the end of the second frame 22 to be connected with the first frame 21 is provided with two protrusions 71 and the positioning groove 70 is formed between the two protrusions 71. In the case that the first frame 21 and the second frame 22 are fixedly connected with each other through the bridge connection piece 80, the two positioning blocks 81 match with their corresponding positioning grooves 70 respectively. For example, the positioning block 81 and the protrusion 71 are fixed together by engaging with each other. For example, one of the positioning block 81 and the protrusion 71 is provided with an engagement hook 82, and the other of the positioning block 81 and the protrusion 71 is provided with a engagement groove 72; the engagement groove 72 is engaged with the engagement hook 82, so that the positioning blocks 81 are fixedly connected with the first frame 21 and the second frame 22 respectively and the connection of the first frame 21 and the second frame 22 is achieved. The structure of the bridge connection piece 80 for connecting the first frame 21 and the fourth frame 23 is same with that of the bridge connection piece 80 for connecting the first frame 21 and the second frame 22 as described above, which will not be repeated here.

The engagement hook 82 and the engagement groove 72 may be provided in different modes, in which if one is provided with the engagement groove 72, then the other is provided with the engagement hook 82. For example, the two positioning blocks 81 are provided with the engagement hooks 82 at opposite distal ends, the protrusions 71 are provided with the engagement grooves 72 engaging with the engagement hooks 82. For example, the two protrusions 71 of each of the first frame 21, the second frame 22 and the fourth frame 23 both are provided with the engagement grooves 72, and the positioning blocks 81 are provided with the engagement hooks 82 engaging with corresponding engagement grooves 72, thereby improving connection strengths of the bridge connection pieces 80.

With further reference to FIG. 6 and FIG. 7, in addition to the aforesaid two positioning blocks 81 connected with each other, the bridge connection piece 80 in the embodiments of the disclosure further comprises a seaming block 83 provided between the two positioning blocks 81; and after the first frame 21 is fixedly connected with the second frame 22 or the fourth frame 23 by the bridge connection piece 80, an outer side surface of the seaming block 83 is aligned with that of the second frame 22 or the fourth frame 23.

The seaming block 83 is for example of an L-shaped structure, and the two positioning blocks 81 are respectively provided on two sides of the L-shaped structure; the two positioning blocks 81 and a vertical portion of the L-shaped structure form a cross-shaped positioning structure. More specifically, the seaming block 83 is of the L-shaped structure, and a shape of the outer side surface of the seaming block 83 is same with that of the second frame 22 or the fourth frame 23, thereby ensuring that the front frame 20 after connection has an appearance as a whole. Meanwhile, the seaming block 83 is provided between the two positioning blocks 81, and the seaming block 83 and the two positioning blocks 81 form the cross-shaped positioning structure; upon installation, a part of the seaming block 83 is provided between the protrusions 71 of the first frame 21 and the protrusions 71 of the second frame 22, and this part abuts against the protrusions 71 to provide a force for facilitating the engagement of the engagement hook 82 and the engagement groove 72, thereby ensuring that the bridge connection piece 80 is fixedly connected with the first frame 21 and the second frame 22, respectively. The above structure can reduce the influence of assembly errors during installation on the products, and improve the yield of the products at the time of installation; meanwhile, the outer side surface of the seaming block 83 is aligned with that of the second frame 22 or the fourth frame 23, thereby ensuring that the front frame 20 after connection has a good appearance.

In addition, the engagement hook 82 and the engagement groove 72 may be provided in different modes, in which if one is provided with the engagement groove 72, then the other is provided with the engagement hook 82. For example, the two positioning blocks 81 are provided with the engagement hooks 82 at opposite distal ends, the protrusions 71 are provided with the engagement grooves 72 engaging with the engagement hooks 82. For example, the two protrusions 71 of each of the first frame 21, the second frame 22 and the fourth frame 23 both are provided with the engagement grooves 72, and the positioning blocks 81 are provided with the engagement hooks 82 engaging with corresponding engagement grooves 72, thereby improving connection strengths of the bridge connection pieces 80.

It should be understood that the bridge connection piece 80 according to the embodiments of the disclosure should not be limited to the specific structures as described above, and any other structure that can achieve the fixed connection between the first frame 21 and the second frame 22 or the fourth frame 23 all can be applied to the embodiments, and the principles thereof are similar to that of the above-mentioned specific embodiments, which will not be repeated here.

Figure 8:
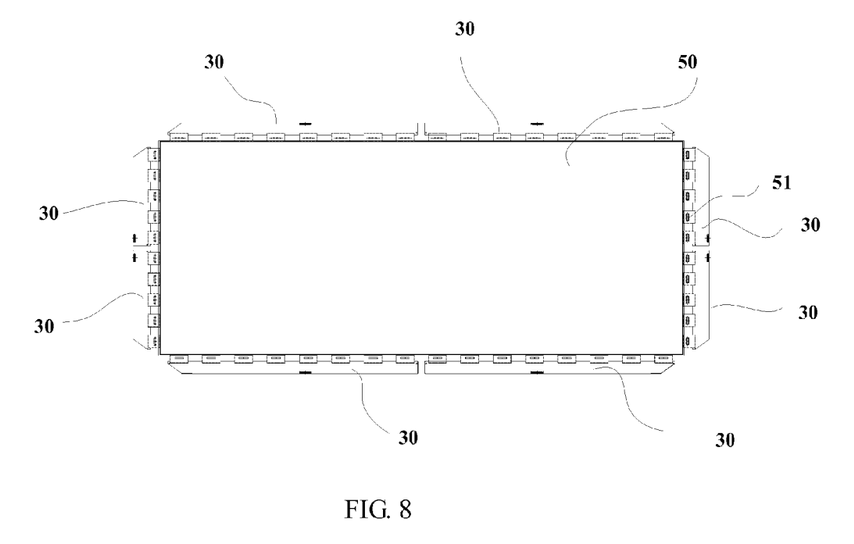
FIG. 8 is a structural schematic view illustrating a display screen according to the embodiments of the disclosure.
Figure 9:
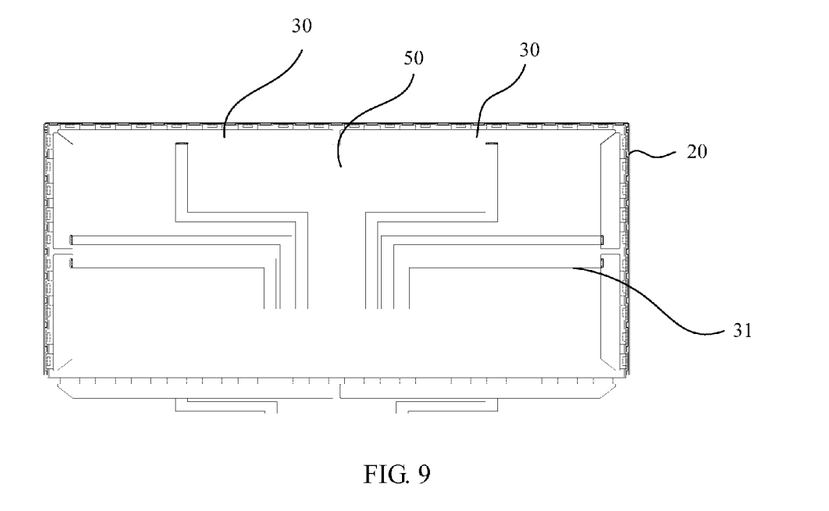
FIG. 9 is a structural schematic view illustrating the display screen and the front frame after being assembled together according to the embodiments of the disclosure.

After the first frame 21, the second frame 22 and the fourth frame 23 are connected together through the bridge connection pieces 80, the display screen 50 is fixed to the connected frames. FIG. 8 is a structural schematic view illustrating the display screen according to the embodiments of the disclosure; FIG. 9 is a structural schematic view illustrating the display screen and the front frame after being assembled together according to the embodiments of the disclosure. As shown in FIG. 8 and FIG. 9, during the assembling process, the printed circuit boards 30 around the display screen 50 are bended to the rear surface of the display screen 50 via the COFs 51, and the display screen 50 and the printed circuit boards 30 are fixed by an adhesive such as double-sided tape. In addition, the side of each of the first frame 21, the second frame 22 and the fourth frame 23 facing the display screen 50 is provided with a adhesive 60 such as foam adhesive, so that the display 50 is bonded with the first frame 21, the second frame 22 and the fourth frame 23 by the adhesive 60, respectively, thus ensuring the connection stability of the display screen 50 and the frames.

Figure 10:
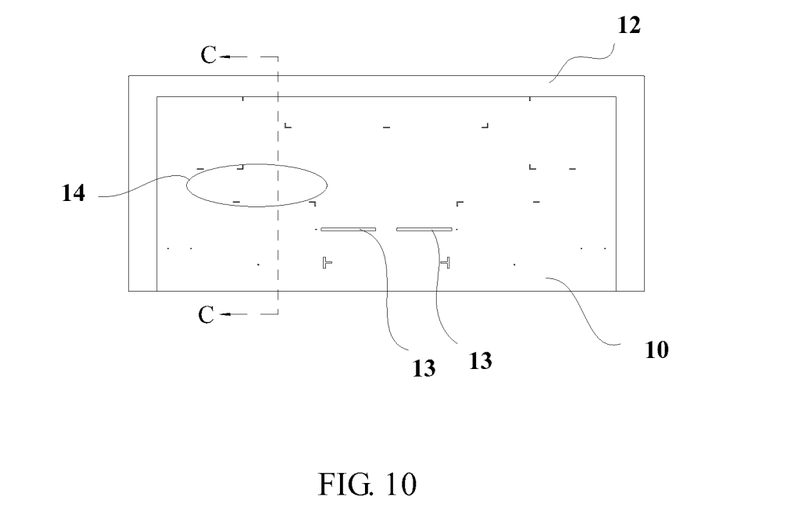
FIG. 10 is a schematic view illustrating a back plate according to the embodiments of the disclosure.
Figure 11:
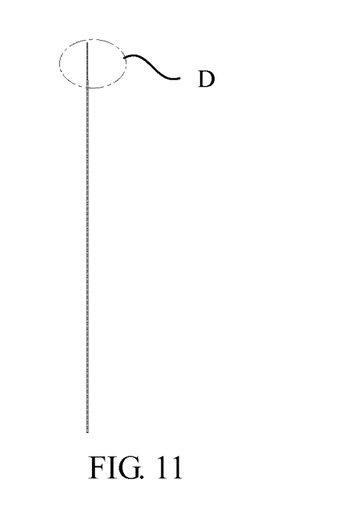
FIG. 11 is a cross-sectional view taken along C-C of FIG. 10.
Figure 12:
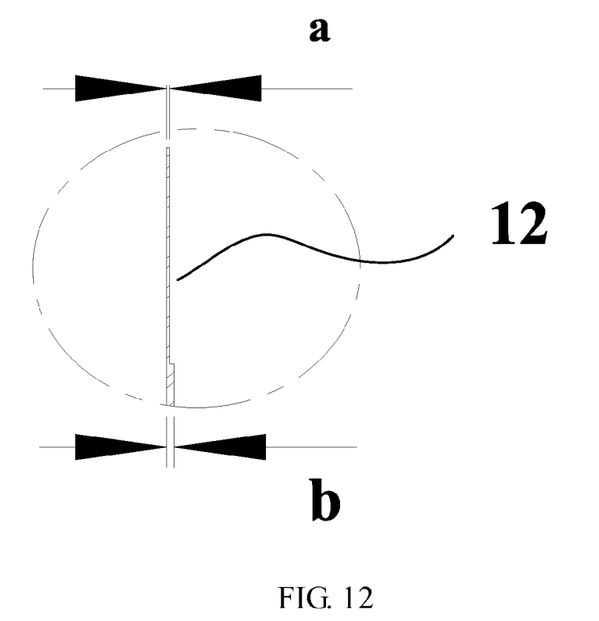
FIG. 12 is an enlarged view of portion D of FIG. 11.

After the display screen 50 and the front frame 20 are assembled together, the back plate 10 is fixed on the rear surface of the display screen 50, and the structure of the back plate is shown in FIG. 10, i.e., the back plate 10 is provided with the recess portion 12 for accommodating the printed circuit board 30 provided between the display screen 50 and the back plate 10. And prior to assembling, the printed circuit board 30 between the back plate 10 and the display screen 50 is connected to a connection line 31 for signally connecting with an external device, the back plate 10 is provided with a cabling channel 14 for accommodating the connection line 31 of the printed circuit board 30 provided between the back plate 10 and the display screen 50, and the back plate 10 is further provided with at least one outlet hole 13 for drawing out the connection line 31 to facilitate the arrangement of the connection line 31. Furthermore, before the back plate 10 and the display screen 50 are fixed together, an insulating sheet 40 is provided between the back plate 10 and the printed circuit board 30, in order to improve the insulation performance therebetween and enhance the safety of the products. For example, the rear surface of the display screen 50 is provided with an adhesive such as foam adhesive, so that the back plate 10 and the display screen 50 are bonded together by the adhesive. In order to facilitate understanding of the structure of the back plate 10, it will be described in detail with reference to FIG. 11 and FIG. 12 hereinafter. FIG. 11 is a cross-sectional view taken along C-C of FIG. 10; and FIG. 12 is an enlarged view at portion D of FIG. 11. A thickness a of an edge of the back plate 10 is less than a thickness b of other portions of the back plate 10, and a difference between the thickness a and the thickness b is slightly greater than a thickness of the printed circuit board 30 so that the thickness of the printed circuit board 30 does not interfere the assembling of the back plate 10 and the display screen 50. In a front view of the back plate 10, there are a series of MARK lines for alignment of the foam adhesive 60 strip; there are two outlet holes 13 in the lower part of the back plate 10, and the power and signal lines between the display screen 50 and the back plate 10 are exported to external interfaces via the outlet holes 13.

Figure 13:
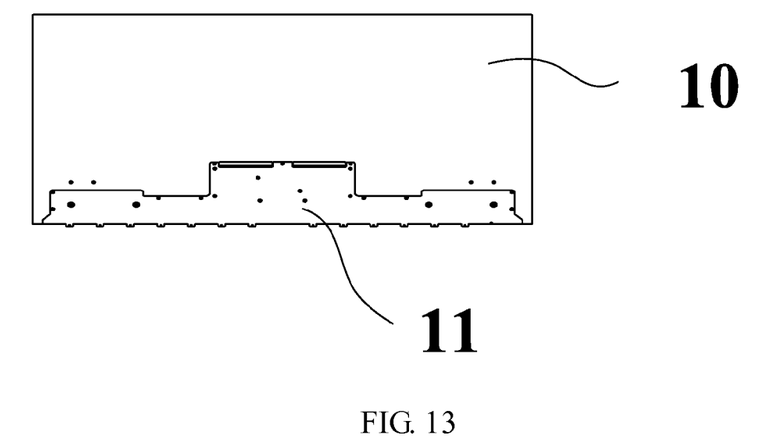
FIG. 13 is a structural schematic view illustrating the back plate and the back plate rear shell after being assembled together according to the embodiments of the disclosure.

FIG. 13 is a structural schematic view illustrating the back plate and the back plate rear shell after being assembled together according to the embodiments of the disclosure. As shown in FIG. 13, in order to further improve the production efficiency of the display device, the detachable display module according to the embodiments of the disclosure further comprises the back plate rear shell 11 provided on the rear surface of the back plate 10 and fixedly connected with the back plate 10, and the back plate rear shell 11 is fixedly connected with the third frame 24 for example by screws. More specifically, in order to reduce the difficulty in shaping the back plate 10, some component are designed on the back plate rear shell 11, and these components for example comprise a system circuit board, a signal board, a loudspeaker, an outer shell and a base support, etc.; meanwhile, the back plate rear shell 11 is fixedly connected with the third frame 24 of the front frame 20 for example by screws. In this way, the conventional integral back plate is divided into the back plate 10 and the back plate rear shell 11 in the embodiments of the disclosure, thereby reducing the production difficulty and improving the production efficiency.

For example, in the case that the back plate rear shell 11 is fixedly connected with the back plate 10, the back plate rear shell 11 and the back plate 10 are bonded by an adhesive such as the foam adhesive 60 to obtain a stable connection.

In order to facilitate the arrangement of lines and installation of the display device, for example, two printed circuit boards 30 are connected to each side of the display screen 50, and the printed circuit boards 30 provided on an upper side, a left side and a right side of the display screen 50 are provided between the display screen 50 and the back plate 10, and the printed circuit boards 30 provided on a lower side of the display screen 50 are provided on a side of the back plate rear shell 11 away from the display screen 50.

Furthermore, the embodiments of the disclosure further provide a display device, and the display device comprises any detachable display module described above.

The display device may be a display panel, an electronic paper, an Organic Light Emitting Diode (OLED) panel, a liquid crystal television, a liquid crystal display, a digital photo frame, a mobile phone, a tablet computer and any other product or component having a display function. In the above embodiments, by using the detachable front frame 20 and the detachable back plate 10, the structures of these components are simplified, and the difficulty in the production of these components is reduced, so that the production efficiency of these components is improved, thereby improving the production efficiency of the display device.

The foregoing embodiments merely are exemplary embodiments of the disclosure, and not intended to define the scope of the disclosure, and the scope of the disclosure is determined by the appended claims.

The present application claims priority of Chinese Patent Application No. 201410234530.2 filed on May 29, 2014, the disclosure of which is incorporated herein by reference in its entirety as part of the present application.

What is claimed is:

1. A detachable display module, comprising: a front frame, a display screen and a back plate; wherein
    a plurality of COFs are provided on each of four sides of the display screen, the plurality of COFs provided on each side of the display screen are connected to at least one printed circuit board, and the printed circuit board is provided on a rear surface of the display screen;
    the front frame is fixedly connected with the display screen, and the front frame comprises: a first frame and a third frame disposed opposite to each other, a second frame and a fourth frame disposed opposite to each other, wherein the first frame is detachably and fixedly connected with the second frame and the fourth frame through bridge connection pieces, the third frame is detachably and fixedly connected with the back plate, and the first frame, the second frame, the third frame and the fourth frame each have a recess regions for accommodating the plurality of COFs; and
    the back plate is provided on the rear surface of the display screen, and the back plate is provided with a recess portion corresponding to the printed circuit board provided between the back plate and the display screen.

2. The detachable display module according to claim 1, wherein
    the bridge connection piece comprises two positioning blocks connected with each other;
    both ends of the first frame, an end of the second frame to be connected with the first frame, and an end of the fourth frame to be connected with the first frame are provided with two protrusions, and a positioning groove is formed between the two protrusions; and
    the positioning groove and the positioning block are interlocked.

3. The detachable display module according to claim 2, wherein
the positioning blocks and the protrusion are fixed together by engaging with each other;
the two positioning blocks are provided with engagement hooks at opposite distal ends, and the protrusions are provided with engagement grooves engaging with the engagement hooks.

4. The detachable display module according to claim 2, wherein
the bridge connection piece further comprises a seaming block provided between the two positioning blocks; and
after the first frame is fixedly connected with the second frame or the fourth frame by the bridge connection piece, an outer side surface of the seaming block is aligned with that of the second frame or the fourth frame.

5. The detachable display module according to claim 4, wherein
the seaming block is of an L-shaped structure, and the two positioning blocks are respectively provided on two sides of the L-shaped structure; and
the two positioning blocks and a vertical portion of the L-shaped structure form a cross-shaped positioning structure.

6. The detachable display module according to claim 1, wherein
a side of each of the first frame, the second frame and the fourth frame facing the display screen is provided with a adhesive, so that the display screen is bonded with the first frame, the second frame and the fourth frame by the adhesive, respectively.

7. The detachable display module according to claim 1, further comprising an insulating sheet provided between the printed circuit board and the back plate.

8. The detachable display module according to claim 1, further comprising a back plate rear shell provided on a rear surface of the back plate and fixedly connected with the back plate, wherein
the back plate rear shell is fixedly connected with the third frame.

9. The detachable display module according to claim 8, wherein
two printed circuit boards are connected to each side of the display screen, the printed circuit boards provided on an upper side, a left side and a right side of the display screen are provided between the display screen and the back plate, and the printed circuit boards provided on a lower side of the display screen are provided on a side of the back plate rear shell away from the display screen.

10. The detachable display module according to claim 9, wherein
the back plate is provided with a cabling channel for accommodating a connection line of the printed circuit board provided between the back plate and the display screen, and the back plate is further provided with at least one outlet hole for drawing out the connection line.

11. A display device, comprising the detachable display module according to claim 1.

12. The detachable display module according to claim 3, wherein
the bridge connection piece further comprises a seaming block provided between the two positioning blocks; and
after the first frame is fixedly connected with the second frame or the fourth frame by the bridge connection piece, an outer side surface of the seaming block is aligned with that of the second frame or the fourth frame.

13. The detachable display module according to claim 12, wherein
the seaming block is of an L-shaped structure, and the two positioning blocks are respectively provided on two sides of the L-shaped structure; and
the two positioning blocks and a vertical portion of the L-shaped structure form a cross-shaped positioning structure.

14. The detachable display module according to claim 2, further comprising a back plate rear shell provided on a rear surface of the back plate and fixedly connected with the back plate, wherein
the back plate rear shell is fixedly connected with the third frame.

15. The detachable display module according to claim 3, further comprising a back plate rear shell provided on a rear surface of the back plate and fixedly connected with the back plate, wherein
the back plate rear shell is fixedly connected with the third frame.

16. The detachable display module according to claim 4, further comprising a back plate rear shell provided on a rear surface of the back plate and fixedly connected with the back plate, wherein
the back plate rear shell is fixedly connected with the third frame.

17. The detachable display module according to claim 5, further comprising a back plate rear shell provided on a rear surface of the back plate and fixedly connected with the back plate, wherein
the back plate rear shell is fixedly connected with the third frame.

18. The detachable display module according to claim 6, further comprising a back plate rear shell provided on a rear surface of the back plate and fixedly connected with the back plate, wherein
the back plate rear shell is fixedly connected with the third frame.

19. The detachable display module according to claim 7, further comprising a back plate rear shell provided on a rear surface of the back plate and fixedly connected with the back plate, wherein
the back plate rear shell is fixedly connected with the third frame.

* * * * *